United States Patent
Tsui et al.

(10) Patent No.: US 7,678,713 B2
(45) Date of Patent: Mar. 16, 2010

(54) ENERGY BEAM TREATMENT TO IMPROVE PACKAGING RELIABILITY

(75) Inventors: Ting Y. Tsui, Garland, TX (US); Andrew McKerrow, Dallas, TX (US); Satyavolu Srinivas Papa Rao, Garland, TX (US); Robert Kraft, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 620 days.

(21) Appl. No.: 11/196,985

(22) Filed: Aug. 4, 2005

(65) Prior Publication Data
US 2007/0032094 A1 Feb. 8, 2007

(51) Int. Cl.
*H01L 21/31* (2006.01)
*H01L 21/469* (2006.01)

(52) U.S. Cl. .................. 438/795; 438/778; 438/790

(58) Field of Classification Search .............. 438/795, 438/799, 781, 771, 776, 760, 612
See application file for complete search history.

(56) References Cited

U.S. PATENT DOCUMENTS

| 6,573,170 B2 * | 6/2003 | Aoyagi et al. ............... 438/612 |
| 2003/0232495 A1 * | 12/2003 | Moghadam et al. ......... 438/623 |
| 2004/0082201 A1 * | 4/2004 | Sharma et al. .............. 438/795 |
| 2005/0042889 A1 | 2/2005 | Lee et al. |
| 2005/0110118 A1 * | 5/2005 | Udupa et al. ................ 257/620 |
| 2006/0128166 A1 * | 6/2006 | Nakata et al. ............... 438/795 |

* cited by examiner

*Primary Examiner*—Ha Tran T Nguyen
*Assistant Examiner*—Valerie Brown
(74) *Attorney, Agent, or Firm*—Warren L. Franz; Wade J. Brady, III; Frederick J. Telecky, Jr.

(57) ABSTRACT

The present invention provides a process for improving the hardness and/or modulus of elasticity of a dielectric layer and a method for manufacturing an integrated circuit. The process for improving the hardness and/or modulus of elasticity of a dielectric layer, among other steps, includes providing a dielectric layer having a hardness and a modulus of elasticity, and subjecting the dielectric layer to an energy beam, thereby causing the hardness or modulus of elasticity to increase in value.

16 Claims, 3 Drawing Sheets

ENERGY BEAM TREATMENT TO IMPROVE PACKAGING RELIABILITY

TECHNICAL FIELD OF THE INVENTION

The present invention is directed, in general, to a process for improving packaging reliability and, more specifically, to a process for improving packaging reliability using an energy beam treatment.

BACKGROUND OF THE INVENTION

It is a fundamental goal in the field of integrated circuit manufacturing to design and manufacture integrated circuits to be as small as possible. As is fundamental in this field, the manufacturing cost of an integrated circuit corresponds strongly to the wafer area occupied by each integrated circuit. Cost can be reduced not only by increasing the number of possible integrated circuits per manufactured wafer, but also by generally providing an increased theoretical yield for a given manufacturing defect density. In addition, the smaller device feature sizes involved in decreasing chip area also provide improved performance, and increased functionality per unit area.

Recent advances in the area of integrated circuit metallization technology have been important in decreasing the necessary chip area for modern integrated circuits. One such advance is the increased number of metal levels that are manufacturable in a device, providing both dramatic reduction in necessary chip area and corresponding dramatic increases in device density. Recent technological advances have also provided significant reductions in the line pitch of conductors in these multiple metal levels, also greatly increasing the functional density of the chip. The advent of copper metallization has also been important in providing reliable small line width conductors in modern integrated circuits.

It is of course important to ensure good electrical isolation between adjacent metal conductors. By way of definition, the insulating material between conductors in the same metallization level is commonly referred to as the intermetal dielectric, or IMD, and the insulating material between conductors in adjacent metallization levels is referred to as the interlayer dielectric, or ILD. For performance and cost reasons, it is desirable to have adjacent conductors as close as possible to one another. This has necessitated the use of so-called "low-k" dielectric materials for the insulator layers between metal conductors. Low-k dielectric materials refers to those insulating materials that have a dielectric constant lower than that of silicon dioxide (that is, having a dielectric constant less than 3.9). Because the capacitance between adjacent conductors depends on the dielectric constant (k) of the insulating material that separates the conductors, as well as the thickness of this insulating material, a low-k dielectric material can be thinner than a higher-k dielectric material, while providing the same or better electrical isolation. The use of low-k dielectric materials is especially important in modern high-frequency integrated circuits.

For 90 nm node devices and beyond, the integration of low-k dielectric materials is required to maintain and improve device performance. Examples of modern low-k dielectric materials include fluorine-doped silicon dioxide (also referred to as fluorinated silicate glass, or FSG), organosilicate glass (OSG), thermoplastic organic polymers, aerogel, xerogel, and other conventional low-k insulator materials. These films, and particularly OSG, have many benefits. However, recently it has been observed that they also have certain drawbacks. Unfortunately, during the manufacturing process, a potential failure mechanism for low-k insulator materials is catastrophic fracture due to fracture resistance (e.g., including but not limited to channel cracking, tunnel cracks, lateral cracks, etc.). The driving force for channel cracking is dependent upon several material properties, with the residual tensile stress, density, hardness, and film modulus of elasticity serving as key factors.

Accordingly, what is needed in the art is a new low-k dielectric material, or a method for manufacturing or treating the traditional low-k dielectric materials, that would reduce or eliminate the aforementioned problems.

SUMMARY OF THE INVENTION

To address the above-discussed deficiencies of the prior art, the present invention provides a process for improving the hardness and/or modulus of elasticity of a dielectric layer and a method for manufacturing an integrated circuit. The process for improving the hardness and/or modulus of elasticity of a dielectric layer, among other steps, includes providing a dielectric layer having a hardness and a modulus of elasticity, and subjecting the dielectric layer to an energy beam, thereby causing the hardness or modulus of elasticity to increase in value.

As indicated above, another embodiment of the present invention is a method for manufacturing an integrated circuit. The method for manufacturing the integrated circuit may include, without limitation: (1) forming transistor structures over a substrate, (2) forming at least one dielectric layer over the transistor structures, the at least one dielectric layer having a hardness and a modulus of elasticity, and (3) subjecting the at least one dielectric layer to an energy beam, thereby causing the hardness or modulus of elasticity to increase in value.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying drawings. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1A:
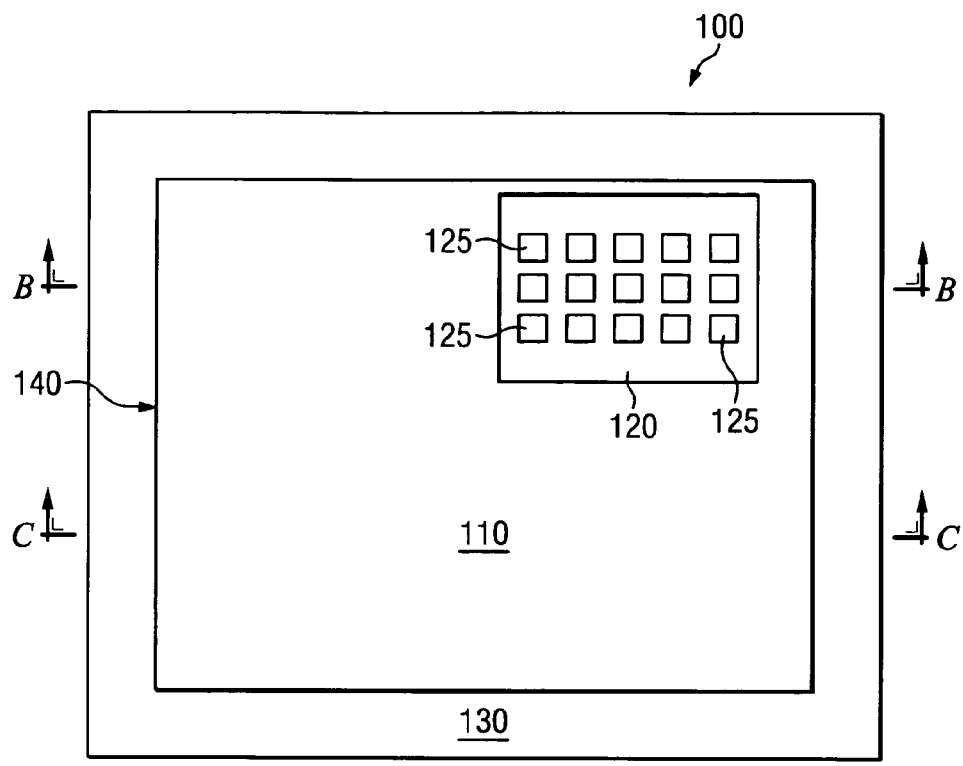
FIG. 1A illustrates a plan view of one embodiment of a chip undergoing an energy beam treatment in accordance with the principles of the present invention.

The present invention is based, at least in part, on the recognition that an energy beam treatment (e.g., curing) of a dielectric layer, and particularly an intermetal or interlevel dielectric layer, may be used to improve the mechanical strength of such dielectric layers. More specifically, the present invention has recognized that such energy beam treatments, whether an ultraviolet (UV) energy beam treatment, an electron beam treatment or another type of energy beam treatment, may be used to improve the hardness and/or modulus of elasticity of such dielectric layers. The present invention observed that by substantially increasing the dielectric layer's hardness and/or modulus using the energy beam treatment, with a minimal rise in residual tensile stress, the potential for catastrophic fracture and failure due to fracture resistance is significantly reduced. The present invention therefore concluded that the structural modifications to the dielectric layers by the energy beam treatment leads to tougher and more robust materials.

It is believed that the substantial improvement of energy beam treated dielectric layers is directly related to molecular structural changes induced during the energy beam treatment. For example, it is believed that most, if not all, of the physical changes observed in these dielectric layers are a direct result of molecular structural rearrangements induced by the energy beam treatment process. This process selectively removes and replaces weak bonding structures in the dielectric layers with more stable structural arrangements, increasing the hardness and/or modulus. By removing bulky methyl ligands ($-CH_3$) and forming more compact Si—O network bonds, the dielectric layers are essentially cross-linked and densified during processing. The mechanical properties of these dielectric layers are, thus, dramatically improved, leading to lower fracture resistance rates and higher film adhesion strengths.

The present invention has recognized, however, that the energy beam treatment may also increase the dielectric constant (k) of the dielectric layers that it affects. Accordingly, the present invention recognized that in certain circumstances those portions of the chip that might be negatively affected by the increased dielectric constant (k) might be masked off from the energy beam treatment. For example, it is generally known that the active die area of the chip should have as low of a dielectric constant (k) as possible. In this instance the active die area may be masked off prior to the energy beam treatment.

On the other hand, it is generally known that the dielectric constant (k) of the bond pad area of the chip is less important than say the mechanical strength of the bond pad area of the chip. In this instance, the bond-pad area of the chip could be exposed to the energy beam treatment. Similarly, the scribe seal area of the chip benefits more from the increased mechanical strength than the low dielectric constant (k). Accordingly, the scribe seal area of the chip is also often exposed to the energy beam treatment.

Turning now to FIG. 1A, illustrated is a plan view of one embodiment of a chip 100 undergoing the energy beam treatment in accordance with the principles of the present invention. The chip 100 illustrated in FIG. 1A includes an active die area 110, a bond pad area 120 and a scribe seal area 130. As those skilled in the art are aware, the active die area 110 typically includes the active circuitry that comprises a majority of the chip 100. As those skilled in the art are also aware, the bond pad area 120 typically includes the bond pads 125 used to electrically contact the active circuitry in the active die area 110. Additionally, the scribe seal area 130 typically contains neither the active circuitry nor the bond pads 125, but is used somewhat as a buffer region for cleaving the chip 100 from a wafer within which it is contained. While the scribe seal area 130 does not typically include active circuitry, it may include non-active circuitry, such as test circuitry or other circuitry used in the chip 100 that is not significantly susceptible to the increased dielectric constant (k) values. In the case where certain test circuits need to maintain their k values without alteration, the sub-section of the scribe seal area that does contain such test circuits can also be masked.

As is illustrated in FIG. 1A, and in accordance with that described directly above, a mask 140, such as a photoresist mask, hardmask or another mask suitable for blocking the energy beam treatment, is formed over the active die area 110. Accordingly, the mask 140 substantially, if not totally, exposes the bond pad area 120 and the scribe seal area 130 to the energy beam treatment. Thus, while the active die area 110 is protected from the energy beam treatment, and therefore maintains its low dielectric constant (k), the bond pad area 120 and the scribe seal area 130 are exposed to the energy beam treatment, thereby causing one or both of their hardness and/or modulus to increase, and thus improve. In addition to the hardness and/or modulus improvement, the density of the exposed portions of the dielectric layers may also improve, thus providing improved hermeticity.

Figure 1B:
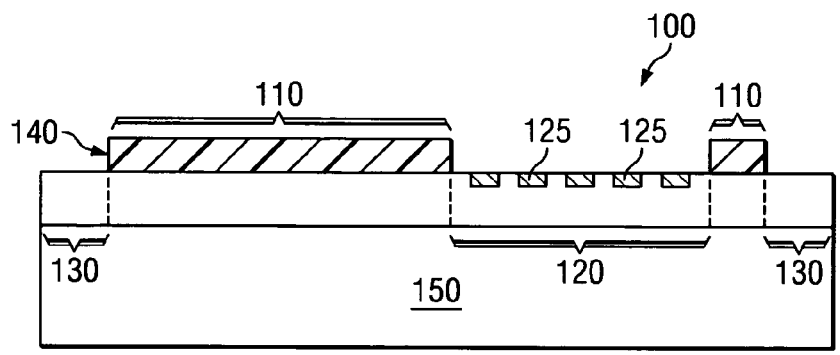
FIGS. 1B and 1C illustrate two cross-sectional views of the chip illustrated in FIG. 1A taken through the lines B-B and C-C, respectively.
Figure 1C:
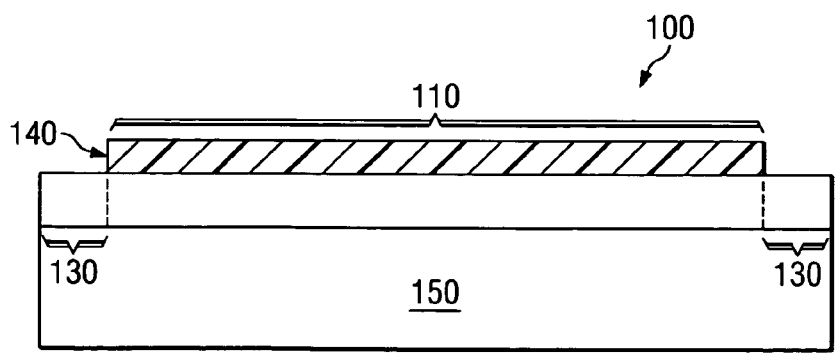

Turning now to FIGS. 1B and 1C, illustrated are two cross-sectional views of the chip 100 illustrated in FIG. 1A, taken through the lines B-B and C-C, respectively. As is illustrated in FIGS. 1B and 1C, the chip 100 further includes a substrate 150, such as a silicon or wafer substrate. Located over the substrate 150 are the active die area 110, the bond pad area 120, including the bond pads 125, and the scribe seal area 130. In accordance with the principles disclosed herein, the mask 140 is uniquely placed to protect the active die area 110 and not the bond pad area 120 or scribe seal area 130.

The energy beam, according to the present invention, may comprise a plurality of different energy beams. For instance, one embodiment exists wherein the energy beam is an ultraviolet (UV) energy beam. In an advantageous embodiment of the present invention the UV energy beam would operate using a power of about 6 kW. In such embodiments, the UV energy beam could be projected through the mask 140 using a wavelength between about 130 nm and about 650 nm. Similarly, the UV energy beam could be projected using a plurality of wavelengths between the aforementioned ranges. The UV energy beam may also generally be conducted for a time period ranging from about 60 seconds to about 60 minutes. Likewise, the temperature associated with the UV energy beam exposure should be less than or equal to about 500° C. Other processing conditions outside of the disclosed ranges may, nevertheless, also be used.

Another embodiment of the invention exists wherein the energy beam is an electron beam. In one exemplary embodiment the electron beam is a less than focused electron beam that is projected through the mask 140. In another embodiment, however, the electron beam is a focused electron beam that is accurately moved across the portions of the chip 100 that need treatment (e.g., direct writing of the focused electron beam). In this embodiment the mask 140 would most likely not be needed.

In the embodiment wherein the electron beam is used to treat the chip 100, the electron beam might use a dose ranging from about 5 $\mu C/cm^2$ to about 5000 $\mu C/cm^2$. In an alternative embodiment, however, the dose might range from about 50 $\mu C/cm^2$ to about 500 $\mu C/cm^2$. Those skilled in the art understand that these doses are representative of the amount of energy per unit area that is being imparted on the dielectric layer. Other conditions that might be used include conducting the electron beam in an enclosure maintained at a pressure approaching a vacuum (e.g., about 0.01 mT). Similarly, the chamber may be maintained at a temperature of less than or equal to about 500° C. Likewise, a voltage differential between two plates of about 3.5 kV might cause the electron beam to have a current of about 3 mA. Other processing conditions outside of the previously discussed ranges are, however, within the purview of the present invention.

What desirably results after exposing the chip 100 to the energy beam is the active die area 110 still having a low dielectric constant (k), as well as the bond pad area 120 and/or scribe seal area 130 having improved hardness and/or modulus. For example, in one advantageous embodiment the dielectric constant (k) of the dielectric layers in the active die area 110 is less than or equal to about 3.0, and even more advantageously less than or equal to about 2.5. On the other hand, in one advantageous embodiment the hardness of the dielectric layers in the bond pad area 120 and scribe seal area 130 is at least about 0.5 GPa, with an exemplary value of at least about 1.5 GPa. Likewise, in one advantageous embodiment the modulus of the dielectric layers in the bond pad area 120 and scribe seal area 130 is at least about 5.0, with an exemplary value of at least about 8.0. Similarly, the densification of the dielectric layers in the bond pad area 120 and the scribe seal area 130 should increase, for example causing a porosity of the dielectric layers to be less than or equal to about 10%. If one or more of the aforementioned properties are improved using the energy beam treatment, the crack growth velocity of the dielectric layers should decrease, and possibly dramatically decrease.

Figure 1D:
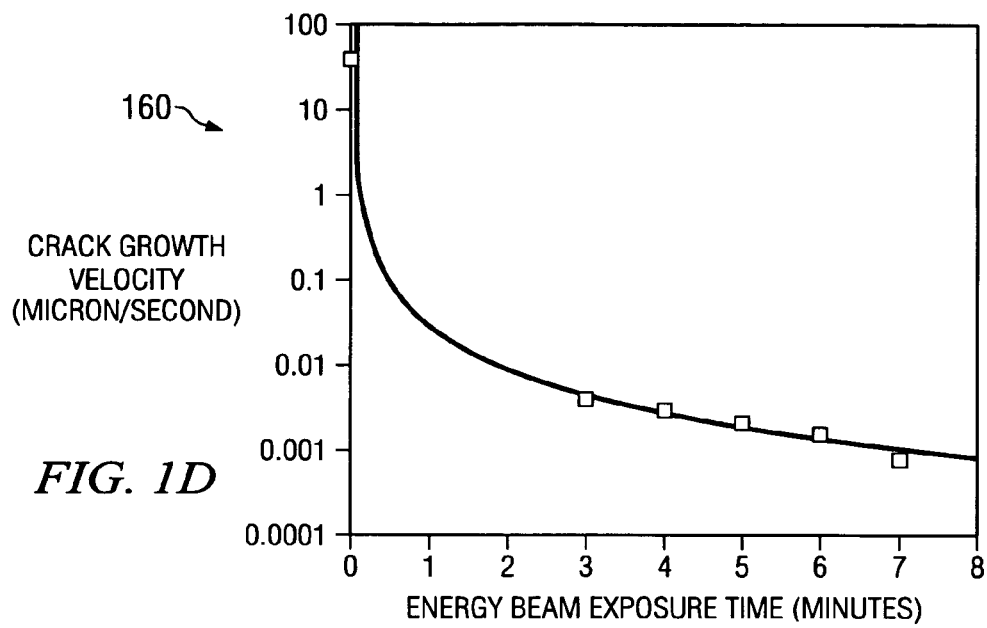
FIG. 1D illustrates a graph showing a power law relationship that might be used to determine the proper energy beam exposure time for a given scenario.

In an ideal situation the energy beam treatment is optimized to provide dielectric layers having the best possible mechanical strength in the bond pad area 120 and the scribe seal area 130, while allowing the dielectric layers to have the lowest possible dielectric constant (k) in the active die area 110. In one embodiment this is accomplished by optimizing the energy beam treatment process according to a power law relationship. One illustration of a power law relationship is shown in the graph 160 depicted in FIG. 1D. The graph 160 compares crack growth velocity (microns/second) versus energy beam exposure time (minutes) for a 1.3 micron thick dielectric film, conducted at about 400° C. As is illustrated, as the exposure time increases the crack growth velocity decreases.

However, once the dielectric film has been subjected to the energy beam treatment for a time period of about 5 minutes, the ramp rate of the graph goes somewhat flat, thereby indicating that the amount of improvement is thereby decreasing. The power law relationship, thus, indicates that in the given situation, a time period of about 5 minutes balances both the crack growth velocity and the dielectric constant (k) value of the dielectric layer. Exposing the dielectric layer to the energy beam treatment beyond the 5 minutes would provide limited crack growth velocity improvement, but could conceivably detrimentally increase the dielectric constant (k) of the dielectric layer.

Figure 2B:
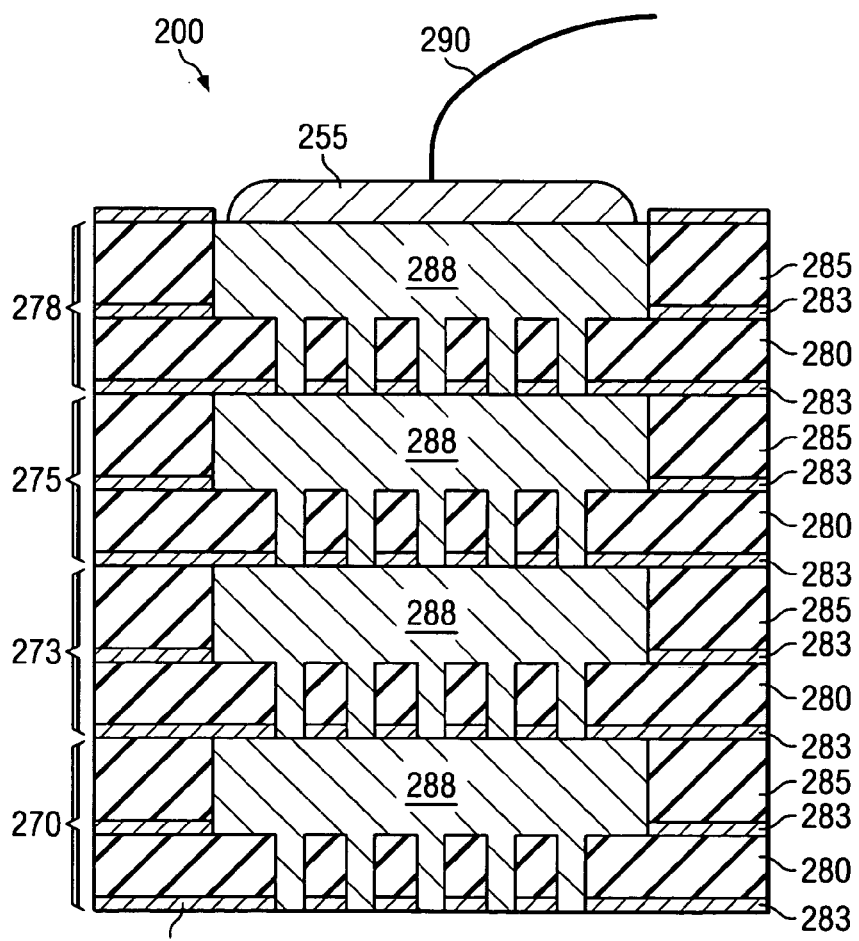
FIG. 2B illustrates an exploded view of a portion of the bond pad area illustrated in FIG. 2A.
Figure 2A:
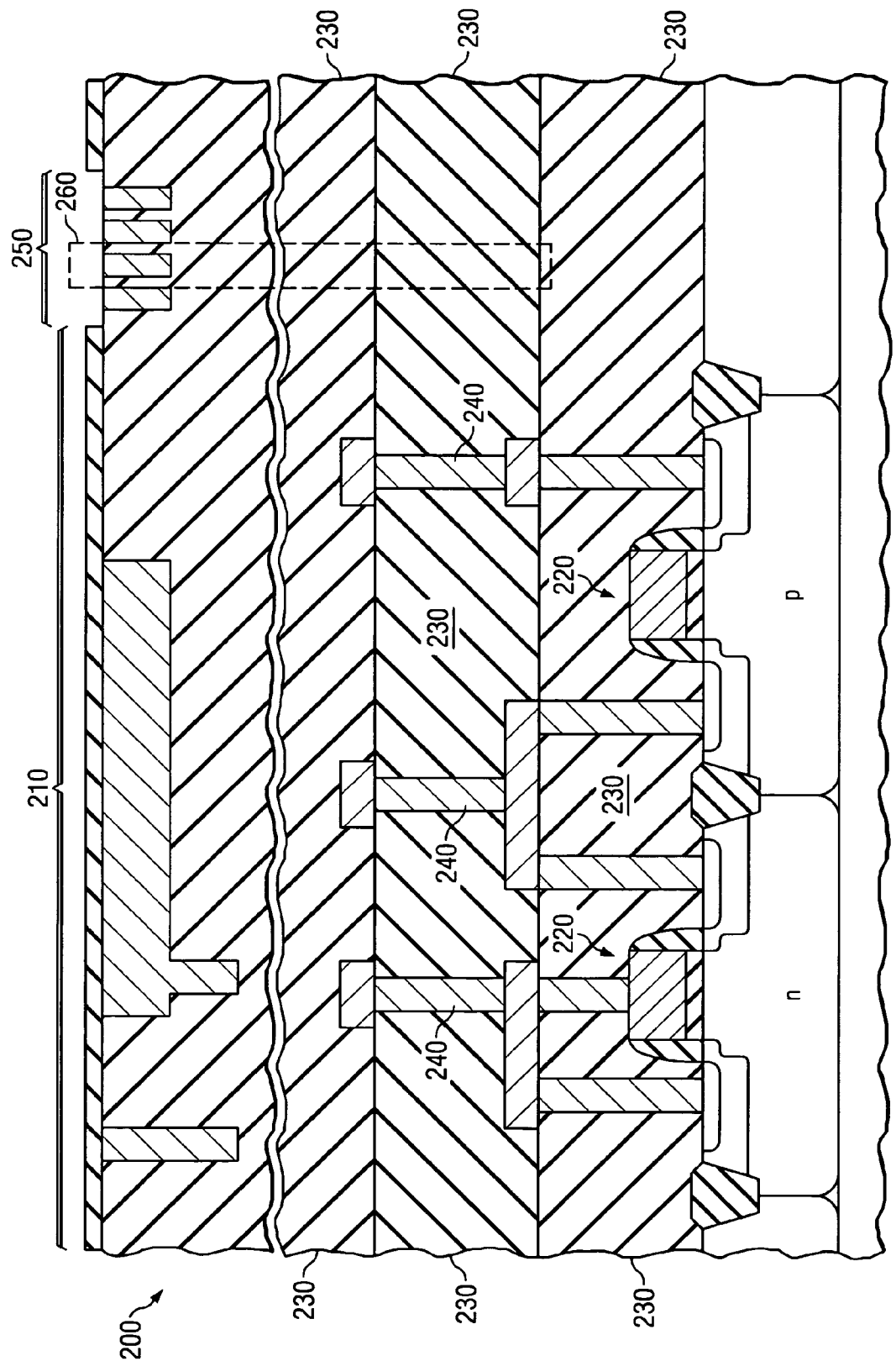
FIG. 2A illustrates an exemplary cross-sectional view of an integrated circuit (IC) that might be exposed to an energy beam treatment in accordance with the principles of the present invention.

Referring now to FIG. 2A, illustrated is an exemplary cross-sectional view of an integrated circuit (IC) 200 that might be exposed to an energy beam treatment in accordance with the principles of the present invention. The IC 200 may include devices, such as transistors used to form CMOS devices, BiCMOS devices, bipolar devices, as well as capacitors or other types of devices. The IC 200 may further include passive devices, such as inductors or resistors, or it may also include optical devices or optoelectronic devices. Those skilled in the art are familiar with these various types of devices and their manufacture. In the particular embodiment illustrated in FIG. 2A, the IC 200 includes an active die area 210, which may encompass the aforementioned devices. The active die area 210, as one would typically expect, includes transistor devices 220 having dielectric layers 230 located thereover. Additionally, interconnect structures 240 are located within the dielectric layers 230 to interconnect various devices, thus, forming the operational integrated circuit 200.

The IC 200 further includes a bond pad area 250. As is illustrated in FIG. 2A, the bond pad area 250 may include bond pads 255. In an exemplary embodiment, it is the bond pad area 250 that is subjected to the energy beam treatment in accordance with the principles of the present invention. While not shown, a scribe seal area may also be subjected to the energy beam treatment.

Turning now to FIG. 2B, illustrated is an exploded view of a portion 260 of the bond pad area 250 illustrated in FIG. 2A. The portion of the IC 200 illustrated in FIG. 2B includes four different metal levels 270, 273, 275, 278. While only four different metal levels 270, 273, 275, 278 are illustrated, those skilled in the art understand that any number may be used. As is illustrated, each of the metal levels 270, 273, 275, 278 may include an interlevel dielectric 280, one or more etch stop layers 283, an intermetal dielectric 285, and a conductive feature 288. The portion of the IC 200 illustrated in FIG. 2B further includes a wire bond 290 coupled to the bond pad 255.

FIG. 2B is being illustrated to show that each of the different metal levels 270, 273, 275, 278 may benefit from performing the energy beam treatment in accordance with the principles of the present invention. One aspect of the present invention uses an individual energy beam treatment after forming each individual metal level 270, 273, 275, 278 to properly improve the mechanical strength of each metal level 270, 273, 275, 278. For example, a mask and energy beam treatment could be used to improve the mechanical strength of the first metal level 270 prior to forming the second metal level 273. This process could continue after forming each metal level 270, 273, 275, 278 until each of the metal levels 270, 273, 275, 278 has been subjected to the energy beam treatment. Alternatively, a single mask and single energy beam treatment could be used to concurrently improve the mechanical strength of each of metal levels 270, 273, 275, 278. While this embodiment may save time and expense, it is believed that the multiple energy beam treatment embodiment may provide better results. Nevertheless, the present invention should not be limited to one embodiment or the other.

The unique aspects of the present invention provide many different benefits. First, and possibly foremost, the unique use of the energy beam allows the improvement of the mechanical strength (e.g., hardness, modulus, density, etc.) of the dielectric layers within the chip. In turn, the unique aspects reduce crack initiation, and thus crack propagation and other cohesive failures. Similarly, the unique aspects of the present invention improve the interface adhesion between the different interlevel dielectric and intermetal dielectric layers. Thus, it further reduces the delamination initiation. Moreover, it is believed that the energy beam treatment increases the hermeticity of the various exposed layers within the chip, thereby reducing the moisture, and thus oxygen diffusion within the chip. Furthermore, the unique aspects of the present invention allow for completely masking off, or alternatively providing a lower energy beam dose, to the active die area of the chip, thus allowing those portions of the chip needing a low dielectric constant (k) to have a low dielectric constant (k).

Although the present invention has been described in detail, those skilled in the art should understand that they can make various changes, substitutions and alterations herein without departing from the spirit and scope of the invention in its broadest form.

What is claimed is:

1. A method for manufacturing an integrated circuit, comprising:
   providing a substrate having an active die area and a bond pad area;
   forming transistor structures over the active die area of the substrate;
   forming at least one dielectric layer having a dielectric constant lower than that of silicon dioxide over the transistor structures in the active die area and over the substrate in the bond pad area, the at least one dielectric layer having a hardness and a modulus of elasticity;
   masking off at least a portion of the at least one dielectric layer over the transistor structures in the active die area, while exposing at least a portion of the at least one dielectric layer over the substrate in the bond pad area; and
   subjecting the masked off and exposed portions of the at least one dielectric layer to an energy beam treatment to cause the hardness or modulus of elasticity of the exposed portion to increase in value, while maintaining the dielectric constant lower than that of silicon dioxide in the masked off portion.

2. The method as recited in claim 1, wherein subjecting the at least one dielectric layer to an energy beam treatment includes subjecting the at least one dielectric layer to an energy beam treatment to cause the hardness of the exposed portion to increase in value.

3. The method as recited in claim 2, wherein subjecting the at least one dielectric layer to an energy beam treatment includes subjecting the at least one dielectric layer to an energy beam treatment to cause both the hardness and modulus of elasticity of the exposed portion to increase in value.

4. The method as recited in claim 1, wherein subjecting the at least one dielectric layer to an energy beam treatment includes subjecting the at least one dielectric layer to an ultraviolet (UV) energy beam.

5. The method as recited in claim 1, wherein subjecting the at least one dielectric layer to an energy beam treatment includes subjecting the at least one dielectric layer to an electron beam.

6. The method as recited in claim 1, wherein the at least one dielectric layer is an organosilicate glass (OSG) dielectric layer.

7. The method as recited in claim 1, wherein subjecting the at least one dielectric layer to an energy beam treatment increases a density or decreases a crack growth velocity of the at least one dielectric layer.

8. The method as recited in claim 4, wherein subjecting the at least one dielectric layer to an ultraviolet (UV) energy beam includes subjecting the at least one dielectric layer to an ultraviolet (UV) energy beam having a wavelength between about 130 nm and about 650 nm, for a time period ranging from about 60 seconds to about 60 minutes, and at a temperature of about 500° C. or less.

9. The method as recited in claim 1, further including forming bond pads over the substrate in the bond pad area prior to masking and subjecting.

10. The method as recited in claim 1, wherein the provided substrate further has a scribe seal area; the at least one dielectric layer is also formed over the substrate in the scribe seal area; masking off the portion over the transistor structures also exposes at least a portion of the at least one dielectric layer over the substrate in the scribe seal area; and subjecting the masked off and exposed portions to an energy beam treatment also causes an increase in the hardness or modulus of elasticity of the exposed portion over the substrate in the scribe seal area.

11. A method for manufacturing an integrated circuit chip, comprising:
   providing a substrate having an active die area and a bond pad area;
   forming a dielectric layer with a dielectric constant lower than that of silicon dioxide over the active die area and bond pad area; the dielectric layer having a hardness and a modulus of elasticity;
   forming a mask over the dielectric layer to protect a portion of the dielectric layer over the active die area and to expose a portion of the dielectric layer over the bond pad area; and
   subjecting the masked dielectric layer to an energy beam treatment to cause the hardness or modulus of elasticity to increase in value in the exposed portion; the mask blocking the energy beam treatment to maintain the dielectric constant lower than that of silicon dioxide in the protected portion.

12. The method as recited in claim 11, wherein the energy beam treatment comprises subjecting the masked dielectric layer to at least one of an ultraviolet (UV) energy treatment and an electron beam energy treatment.

13. The method as recited in claim 11, wherein the dielectric constant in the protected portion after energy beam treatment is less than or equal to 2.5; and the hardness of the exposed portion after energy beam treatment is at least 1.5 GPa.

14. A method for manufacturing an integrated circuit chip, comprising:
   providing a substrate having an active die area, a bond pad area, and a scribe seal area;
   forming a dielectric layer with a dielectric constant lower than that of silicon dioxide over the active die area, bond pad area and scribe seal area; the dielectric layer having a hardness and a modulus of elasticity;
   forming a mask over the dielectric layer to protect a portion of the dielectric layer over the active die area and to expose portions of the dielectric layer over the bond pad area and scribe seal area; and
   subjecting the masked dielectric layer to an energy beam treatment to cause the hardness or modulus of elasticity to increase in value in the exposed portions; the mask blocking the energy beam treatment to maintain the dielectric constant lower than that of silicon dioxide in the protected portion.

15. The method as recited in claim 14, wherein the energy beam treatment comprises subjecting the masked dielectric layer to at least one of an ultraviolet (UV) energy treatment and an electron beam energy treatment.

16. The method as recited in claim 14, wherein the dielectric constant in the protected portion after energy beam treatment is less than or equal to 2.5; and the hardness of the exposed portions after energy beam treatment is at least 1.5 GPa.

* * * * *